(12) United States Patent
Mabuchi

(10) Patent No.: US 9,692,999 B2
(45) Date of Patent: Jun. 27, 2017

(54) SOLID-STATE IMAGING DEVICE AND ELECTRONIC EQUIPMENT

(71) Applicant: Sony Corporation, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/226,230

(22) Filed: Aug. 2, 2016

(65) Prior Publication Data

US 2016/0344959 A1  Nov. 24, 2016

Related U.S. Application Data

(63) Continuation of application No. 15/205,464, filed on Jul. 8, 2016, which is a continuation of application (Continued)

(30) Foreign Application Priority Data

Nov. 11, 2010 (JP) .................................. 2010-252587

(51) Int. Cl.
*H04N 5/365* (2011.01)
*H01L 27/146* (2006.01)
(Continued)

(52) U.S. Cl.
CPC ....... *H04N 5/365* (2013.01); *H01L 27/14612* (2013.01); *H01L 27/14632* (2013.01);
(Continued)

(58) Field of Classification Search
CPC .... H04N 5/365; H04N 5/37455; H04N 5/378; H04N 5/3575; H04N 5/37457;
(Continued)

(56) References Cited

U.S. PATENT DOCUMENTS 6,809,769 B1 * 10/2004 Yang ................ H01L 27/14601
257/E31.112
2004/0239791 A1  12/2004 Mabuchi
(Continued)

FOREIGN PATENT DOCUMENTS

CN    1233806 A    11/1999
JP    2003-018471    1/2003
(Continued)

OTHER PUBLICATIONS

Japanese Office Action issued Jul. 8, 2014 for corresponding Japanese Application No. 2010-252587.
(Continued)

*Primary Examiner* — Mekonnen Dagnew
(74) *Attorney, Agent, or Firm* — Michael Best & Friedrich LLP

(57) ABSTRACT

A solid-state imaging device includes a pixel unit in which a plurality of pixels converting physical quantities into electric signals are arranged in a two-dimensional shape, a vertical signal line for reading signals from the pixels, and column circuits arranged corresponding to columns of the pixel unit and collecting the signals from the vertical signal line at the inside of the pixel unit.

15 Claims, 14 Drawing Sheets

Related U.S. Application Data

No. 14/738,147, filed on Jun. 12, 2015, now Pat. No. 9,462,201, which is a continuation of application No. 13/317,377, filed on Oct. 17, 2011, now Pat. No. 9,087,758.

(51) Int. Cl.
  *H04N 5/357* (2011.01)
  *H04N 5/378* (2011.01)
  *H04N 5/374* (2011.01)
  *H04N 5/3745* (2011.01)

(52) U.S. Cl.
  CPC .. *H01L 27/14634* (2013.01); *H01L 27/14636* (2013.01); *H01L 27/14643* (2013.01); *H04N 5/3575* (2013.01); *H04N 5/374* (2013.01); *H04N 5/378* (2013.01); *H04N 5/37455* (2013.01); *H04N 5/37457* (2013.01)

(58) Field of Classification Search
  CPC .............. H04N 5/374; H01L 27/14643; H01L 27/14612; H01L 27/14634; H01L 27/14636; H01L 27/14632
  See application file for complete search history.

(56) References Cited

U.S. PATENT DOCUMENTS

| | | |
|---|---|---|
| 2006/0023109 A1 | 2/2006 | Mabuchi et al. |
| 2006/0197007 A1 | 9/2006 | Iwabuchi et al. |
| 2007/0181780 A1 | 8/2007 | Suzuki et al. |
| 2009/0125979 A1 | 5/2009 | Shimada et al. |
| 2009/0190012 A1 | 7/2009 | Mabuchi et al. |
| 2010/0045837 A1 | 2/2010 | Yamashita |
| 2010/0276572 A1 | 11/2010 | Iwabuchi et al. |
| 2010/0302178 A1* | 12/2010 | Liu .................... G06F 3/041 345/173 |
| 2010/0309356 A1 | 12/2010 | Ihara et al. |
| 2012/0245647 A1 | 9/2012 | Kunz |
| 2012/0286140 A1 | 11/2012 | Itano |

FOREIGN PATENT DOCUMENTS

| | | |
|---|---|---|
| JP | 2006-049361 | 2/2006 |
| JP | 2007-013089 | 1/2007 |
| JP | 2009-170448 A | 7/2009 |
| JP | 2010-171521 A | 8/2010 |
| JP | 2010-225927 A | 10/2010 |
| JP | 2010-245955 A | 10/2010 |
| WO | WO-2004/105137 A1 | 12/2004 |
| WO | WO-2006/129762 | 12/2006 |

OTHER PUBLICATIONS

Chinese Office Action issued Mar. 30, 2015 for corresponding Chinese Application No. 201110344662.7.
Korean Office Action issued Dec. 7, 2016 for corresponding Korean Application No. 10-2011-0104429.

* cited by examiner

SOLID-STATE IMAGING DEVICE AND ELECTRONIC EQUIPMENT

CROSS REFERENCES TO RELATED APPLICATIONS

This is a Continuation of application Ser. No. 15/205,464, filed on Jul. 8, 2016, which is a Continuation application Ser. No. 14/738,147, filed on Jun. 12, 2015, which is a Continuation of application Ser. No. 13/317,377, filed on Oct. 17, 2011, now U.S. Pat. No. 9,087,758, issued on Jul. 21, 2015, and contains subject matter related to Japanese Patent Application JP 2010-252587, filed in the Japanese Patent Office on Nov. 11, 2010, the entire contents of which are incorporated herein by reference.

BACKGROUND

The present disclosure relates to a solid-state imaging device, and particularly to a CMOS solid-state imaging device and electronic equipment such as a camera having the solid-state imaging device.

As a solid-state imaging device (an image sensor), a CMOS solid-state imaging device is famous in the art. The CMOS solid-state imaging device is used for various portable terminals such as digital still cameras, digital video cameras, and camera-embedded cellular phones.

In a general CMOS solid-state imaging device, a circuit for receiving a signal of a pixel and performing CDS (collated double sampling) or AD (analog/digital) conversion thereto is generally provided to every pixel column at an end of a pixel unit in which a plurality of pixels are arranged, as disclosed in Japanese Unexamined Patent Application Publication No. 2003-18471. This circuit is called a column circuit here since it is provided to every column.

As another CMOS solid-state imaging device, also famous is a solid-state imaging device in which a circuit for receiving a pixel signal and performing CDS or AD conversion is provided to each pixel or each section of a plurality of pixels, not to each pixel column, on the premise that a semiconductor chip is laminated, as disclosed in Japanese Unexamined Patent Application Publication No. 2006-49361. In the case where a pixel signal is received for each section of a plurality of pixels, as shown in a schematic view of FIG. 15A, in a pixel unit 201 in which the plurality of pixels are arranged in a two-dimensional shape, the pixels are divided into a plurality of sections so that a region including a plurality of pixels is set to one section 202. In addition, each pixel section 202 is configured to receive a signal from one circuit as above. In each pixel section 202, pixel signals are read in order as shown by a solid line arrow 203 and a dashed line 204. Signals are read simultaneously at every pixel section 202.

Incidentally, as related technologies of the CMOS solid-state imaging device, a CMOS solid-state imaging device in which a semiconductor chip is laminated in a rear-side incident type is disclosed in International Publication No. WO 2006/129762 and Japanese Unexamined Patent Application Publication No. 2007-013089.

SUMMARY

However, in the CMOS solid-state imaging device in which a column circuit is provided to each pixel column, a long vertical signal line runs on the pixel unit, and the column circuit receives a signal at its end. For this reason, the signal from a pixel at the upper end in the vertical direction of the pixel unit is in a different level from the signal from a pixel at the lower end due to the voltage drop caused by the wiring resistance of the vertical signal line. This difference in signal level is offset and removed by CDS, but somewhat shaded since the offset suppression ratio of CDS is not infinite. In addition, the offset makes the operation range of CDS narrower or becomes an obstacle against the decrease of voltage.

In addition, in the case where the column circuits are provided to both upper and lower ends of the pixel unit, the offset changes depending on whether a signal is read by a pixel at the upper column circuit or the lower column circuit even though pixels are located substantially at the same location, which results in a difference in properties. This problem is becoming more serious due to recent increases in the pixel current due to the speed increases in the CMOS solid-state imaging device, increasing the pixel unit due to a growth in size, by making wirings thinner due to pixel miniaturization, or by applying strict requirements on the image quality.

In this point, in the method for providing a circuit for performing CDS or AD conversion for each pixel or each section of a plurality of pixels, the size of the circuit is determined in length and width by size of the pixel or the section of a plurality of pixels. For this reason, a necessary function may not be included, or the circuit may have a spare area which is wasted. In addition, in the case where a circuit is provided to each section of a plurality of pixels, unless a method for ensuring simultaneity of the exposure time in a screen, which is called global shutter, is used, when an object 206 moving in an arrow direction 205 is imaged as shown in FIG. 15B, pixels in the upper half part of the pixel unit 201 are read later and pixels in the lower half part are read earlier as shown in FIG. 15C, resulting in distorted imaging of the moving object 206. The global shutter is necessary to deteriorate image quality or increase a pixel size.

The present disclosure has been made in view of such circumstances, and it is desirable to provide a solid-state imaging device which decreases a voltage drop of a vertical signal line and improves image quality by improving shading or the like.

It is also desirable to provide electronic equipment such as a camera having the solid-state imaging device.

According to an embodiment of the present disclosure, a solid-state imaging device includes a pixel unit in which a plurality of pixels converting physical quantities into electric signals are arranged in a two-dimensional shape, a vertical signal line for reading signals from the pixels, and column circuits arranged corresponding to columns of the pixel unit and collecting the signals from the vertical signal line at the inside of the pixel unit.

In the solid-state imaging device according to the embodiment of the present disclosure, since the signals of pixels are collected to the column circuits not from an end of the pixel unit but from the inside of the pixel unit from the vertical signal line, the voltage drop caused by the wiring resistance of the vertical signal line decreases.

According to the embodiment of the present disclosure, a solid-state imaging device includes an upper substrate having a pixel unit in which a plurality of rear-side incident type pixels converting physical quantities into electric signals are arranged in a two-dimensional shape; and a lower substrate facing the upper substrate and having a plurality of column circuits arranged corresponding to columns of the pixel unit, wherein the upper substrate and the lower substrate are connected at the wiring surface sides thereof, wherein a vertical signal line formed at the upper substrate and reading signals from the pixels are connected to the column circuits of the lower substrate at a side where the column circuits face each other in the vertical direction of a surface of the lower substrate, and wherein signals of the column circuits are output to a side where the column circuits do not face each other.

In the solid-state imaging device according to the embodiment of the present disclosure, since the vertical signal line reading signals from pixels and the column circuits of the lower substrate are connected at a side where the column circuits face each other in the vertical direction of the surface of the lower surface, the voltage drop caused by the wiring resistance of the vertical signal line decreases.

According to an embodiment of the present disclosure, the electronic equipment includes a solid-state imaging device; an optical system for leading incident light to a photoelectric conversion unit of the solid-state imaging device; and a signal processing circuit for processing an output signal of the solid-state imaging device, wherein the solid-state imaging device is the solid-state imaging device according to the present disclosure.

In the electronic equipment according to the embodiment of the present disclosure, since the solid-state imaging device according to the present disclosure is provided, the voltage drop caused by wiring resistance of the vertical signal line decreases when the signals of pixels are collected from the vertical signal line to the column circuits.

According to the solid-state imaging device of the embodiments of the present disclosure, since the voltage drop caused by the wiring resistance of the vertical signal line decreases when a signal of a pixel is read, it is possible to improve image quality, for example improving the shading caused by the voltage drop. Therefore, it is possible to provide high-quality solid-state imaging device.

According to the electronic equipment of the embodiment of the present disclosure, in the solid-state imaging device, since the voltage drop caused by the wiring resistance of the vertical signal line decreases when a signal of a pixel is read, it is possible to improve image quality, for example improving the shading caused by the voltage drop. Therefore, it is possible to provide high-quality electronic equipment.

DETAILED DESCRIPTION OF EMBODIMENTS

Hereinafter, embodiments of the present disclosure will be described. The description will be provided in the following order.

1. Example of a schematic configuration of a CMOS solid-state imaging device

2. First embodiment (an example of the solid-state imaging device)

3. Second embodiment (an example of the solid-state imaging device)

4. Third embodiment (an example of the solid-state imaging device)

5. Fourth embodiment (an example of the electronic equipment)

1. Example of a Schematic Configuration of a CMOS Solid-State Imaging Device

Figure 14:
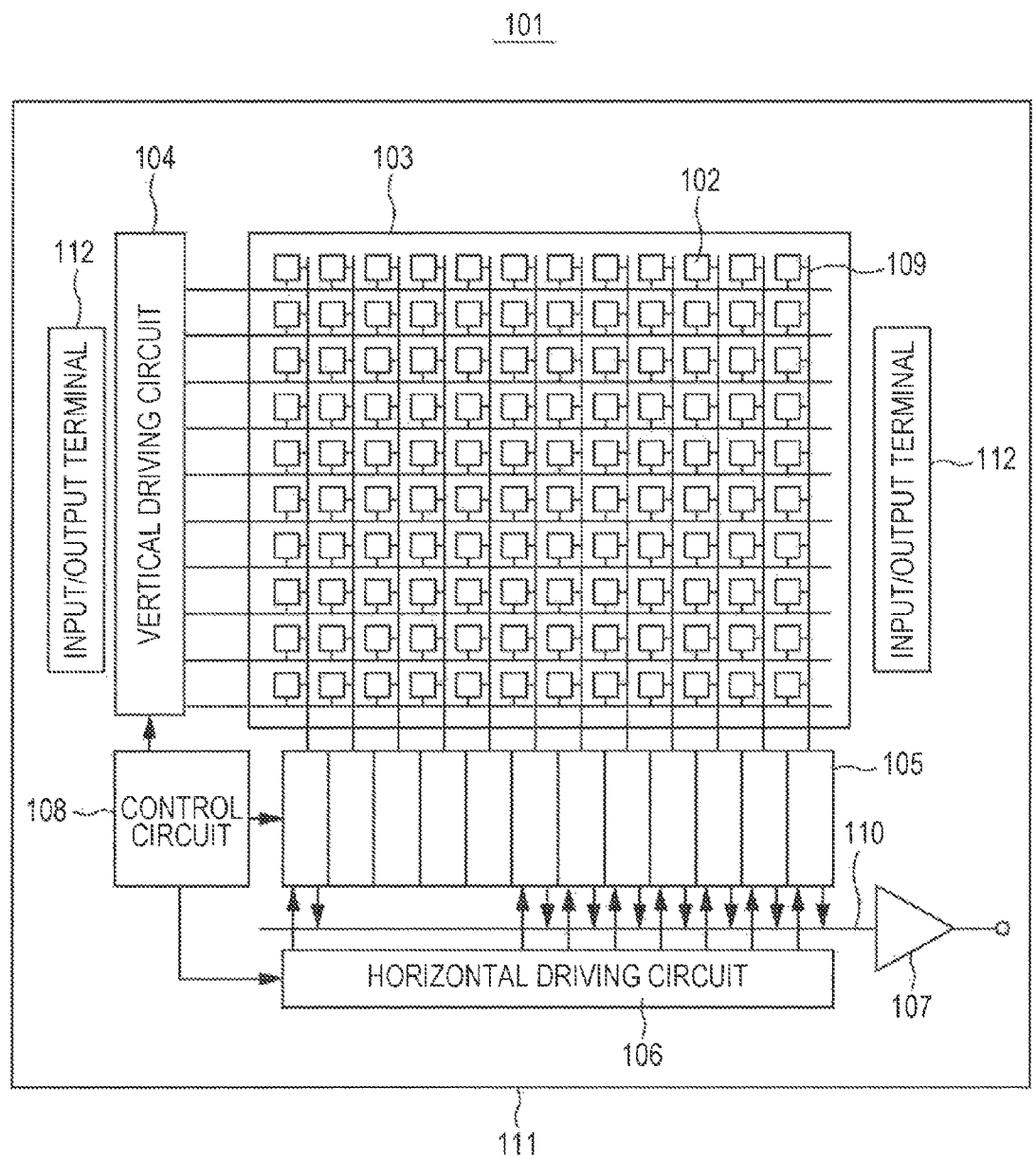
FIG. 14 is a schematic view showing one example of a CMOS solid-state imaging device.
Figure 15A:
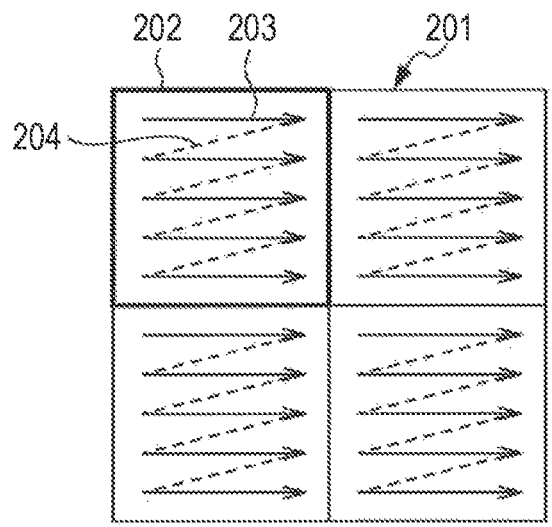
FIGS. 15A to 15C are schematic views showing configurations of existing solid-state imaging devices and images obtained by imaging a moving object.
Figure 15B:
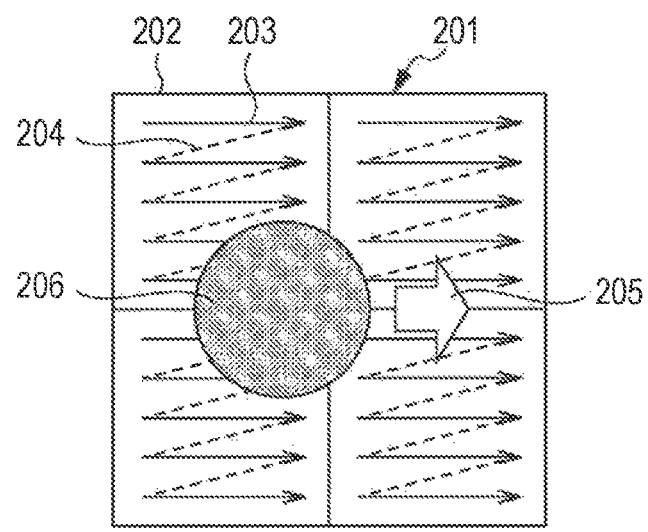
Figure 15C:
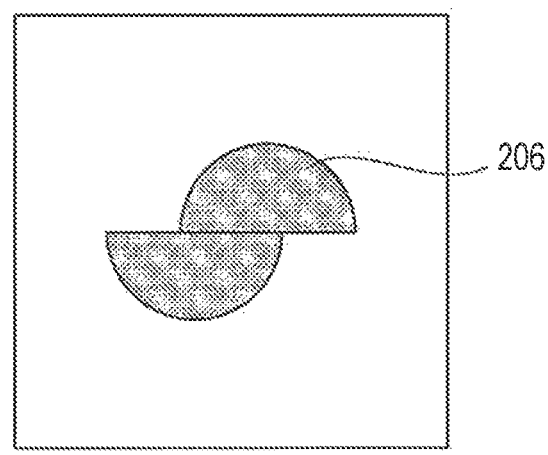

First, for the understanding of the present disclosure, one example of a schematic configuration of a CMOS solid-state imaging device will be described with reference to FIG. 14. The CMOS solid-state imaging device 101 includes a pixel unit (a so-called imaging region) 103 having a plurality of pixels 102 provided with a photoelectric conversion unit provided in a silicon substrate and regularly arranged in a two-dimensional shape on a semiconductor substrate 111, and a peripheral circuit unit. As the pixel 102, a unit pixel composed of one photoelectric conversion unit and a plurality of pixel transistors may be applied. In addition, as the pixel 102, a so-called pixel-sharing structure where a plurality of photoelectric conversion units shares pixel transistors other than a transmission transistor may be applied. The plurality of pixel transistor may be configured with four transistors composed of a transmission transistor, a reset transistor, an amplification transistor and a selection transistor, or three transistors where the selection transistor is excluded.

The peripheral circuit unit is configured with so-called logic circuits such as a vertical driving circuit 104, a column circuit 105, a horizontal driving circuit 106, an output circuit 107 and a control circuit 108.

The control circuit 108 receives data instructing an input clock, an operation mode or the like and outputs data such as internal information of the solid-state imaging device. In addition, the control circuit 108 generates a clock signal or a control signal which will become criteria of operations of the vertical driving circuit 104, the column circuit 105 and the horizontal driving circuit 106 based on a vertical synchronizing signal, a vertical synchronizing signal and a master clock. In addition, those signals are input to the vertical driving circuit 104, the column circuit 105, the horizontal driving circuit 106, and so on.

The vertical driving circuit 104 is, for example, composed of shift registers, selects a pixel driving wiring to supply a pulse for driving a pixel to the selected pixel driving wiring, and drives pixels for each row. In other words, the vertical driving circuit 104 selectively scans each pixel 102 of the pixel unit 103 for each row successively in the vertical direction. In addition, the vertical driving circuit 104 supplies through a vertical signal line 109 a pixel signal based on the generated signal charge to the column circuit 105 according to the amount of light received in, for example, a photodiode which becomes a photoelectric conversion element of each pixel 2.

The column circuit 105 is disposed to, for example, every column of the pixels 102 and performs signal pressing such as noise removal of a signal output from pixels 102 in one row for every pixel column. In other words, the column circuit 105 performs signal processing such as CDS, signal amplification, and AD conversion in order to remove a fixed-patterned noise inherent in the pixels 102. A horizontal selection switch (not shown) is installed to the column circuit 105 to be connected to a horizontal signal line 110.

The horizontal driving circuit 106 is, for example, composed of shift registers and selects the column circuits 105 in order by successively outputting horizontal scanning pulses so that a pixel signal is output from each column circuit 105 to the horizontal signal line 110.

The output circuit 107 processes and outputs signals successively supplied from each column circuit 105 through the horizontal signal line 110. For example, the output circuit 107 may perform only buffering or perform black level adjustment, column deviation correction, or various digital processes. The input/output terminal 112 exchanges signals with the outside.

2. First Embodiment

Example of the Solid-State Imaging Device

Figure 1:
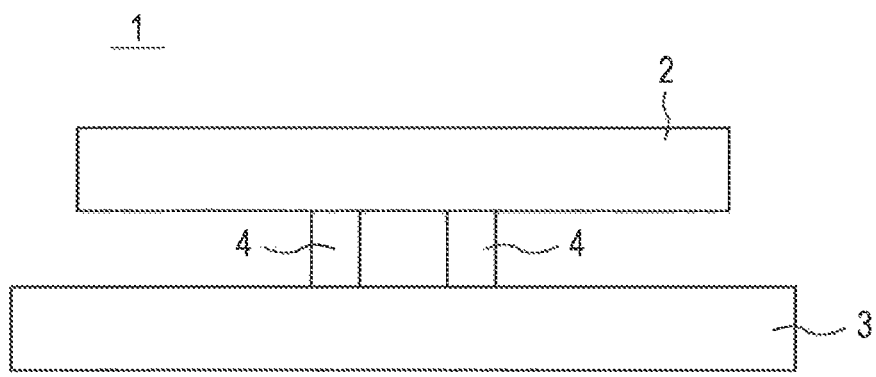
FIG. 1 is a schematic view showing a first embodiment of a solid-state imaging device according to an embodiment of the present disclosure.
Figure 2A:
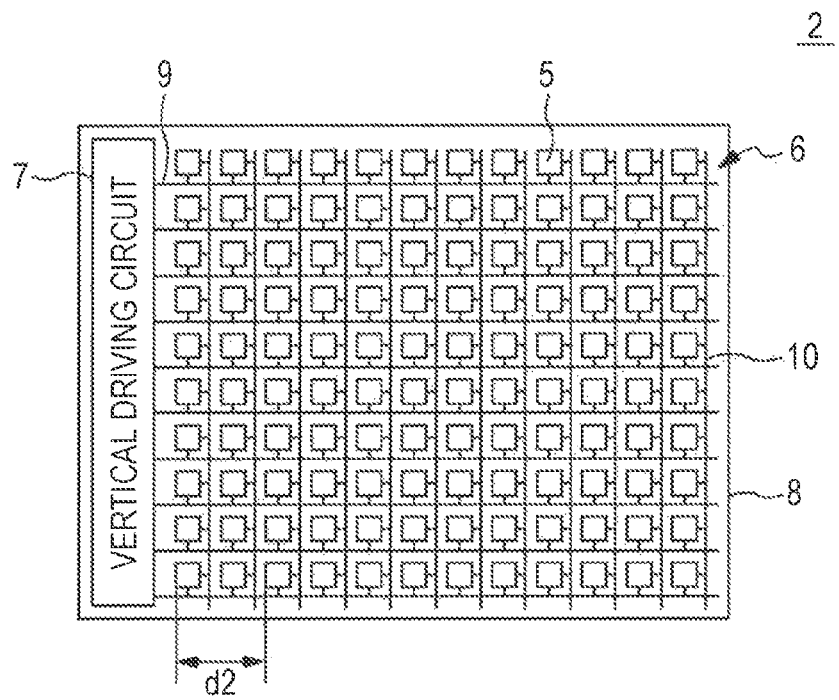
FIGS. 2A and 2B are schematic plan views showing a first semiconductor chip and a second semiconductor chip according to the first embodiment.
Figure 2B:
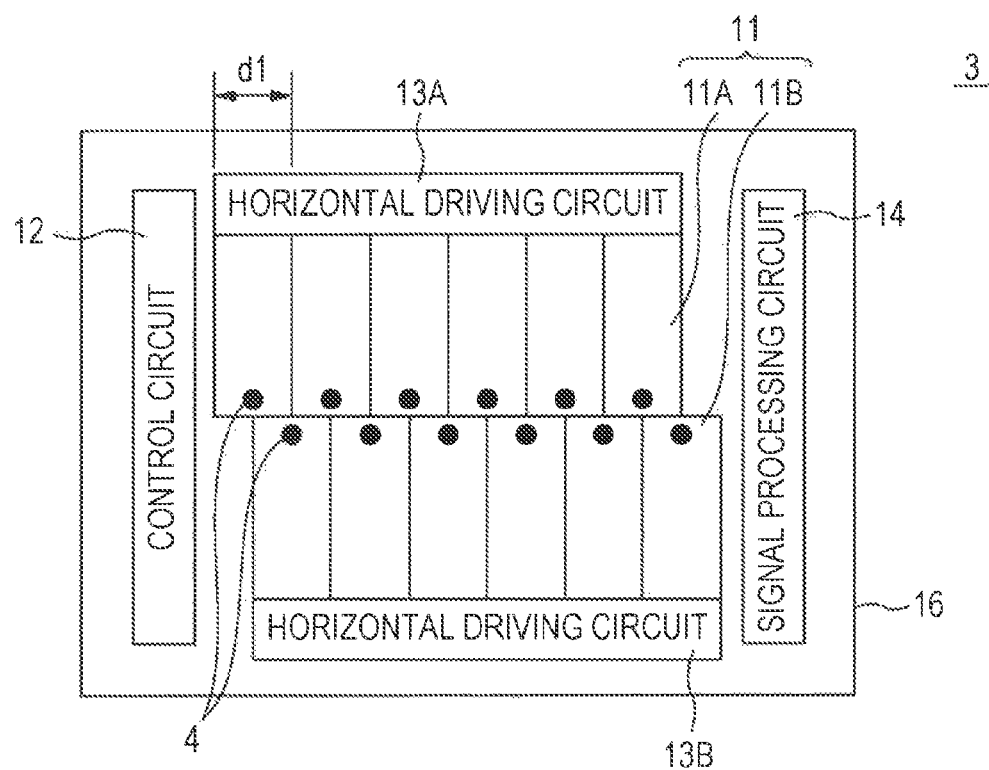

FIGS. 1 to 2B show the first embodiment of the solid-state imaging device according to the present disclosure. This embodiment is a rear-side incident type CMOS solid-state imaging device, and FIGS. 1 to 2B are schematic views of the whole configuration.

In the solid-state imaging device 1 according to the first embodiment, as shown in FIG. 1, a first substrate 2 having a pixel unit in which a plurality of pixels converting physical quantities into electric signals are arranged in a two-dimensional shape and a second substrate 3 having column circuits are laminated and electrically connected through a connection portion 4. In other words, the first substrate 2 includes, as shown in FIG. 2A, a pixel unit 6 in which a plurality of rear-side incident type pixels 5 are arranged in a two-dimensional shape, and a first semiconductor chip having a vertical driving circuit 7. Hereinafter, the first substrate 2 will be called a first semiconductor chip. The first semiconductor chip 2 is a so-called rear-side incident type CMOS image sensor chip. The second substrate 3 is, as shown in FIG. 2B, configured as a second semiconductor chip including a column circuit 11, a control circuit 12, a horizontal driving circuit 13, and a signal processing circuit 14 corresponding to an output circuit. Hereinafter, the second substrate 3 will be called a second semiconductor chip. The first semiconductor chip (corresponding to an upper substrate) 2 is mounted in a flip-chip manner to the second semiconductor chip (corresponding to a lower substrate) 3 through a micro bump serving as the connection portion 4 to configure the solid-state imaging device 1. Hereinafter, the connection portion 4 will be called a micro bump.

The first semiconductor chip 2 includes a pixel unit 6 in which a plurality of pixels, each having a photodiode (PD) serving as a photoelectric conversion portion and a plurality of pixel transistors are arranged in a two-dimensional shape, and a vertical driving circuit 7 to the semiconductor substrate 8. The photodiode (PD) is formed to face the rear side of the semiconductor substrate 8, and the pixel transistor includes a floating diffuser (FD) and is formed at the surface side of the semiconductor substrate 8. The rear side of the substrate becomes a light receiving surface, and though not shown in the figures, an anti-reflection film, a color filter, an on-chip lens and so on are laminated on the light receiving surface.

The vertical driving circuit 7 is connected to a pixel driving wiring 9 which supplies a pulse voltage to drive the pixel 5. The pixel driving wiring 9 is commonly connected to pixels 5 of each one row arranged in the horizontal direction of the pixel unit, and, even though one wiring formed in the horizontal direction (the lateral direction) is representatively shown in FIG. 2A, a plurality of pixel driving wirings 9 are disposed as described below. In addition, a vertical signal line 10 is disposed to pixels 5 of each column in the vertical direction of the pixel unit 6. The pixel driving wiring and the vertical signal line are formed as a plurality of wiring layers disposed through an interlayer isolation film at the surface side of the semiconductor substrate.

At the pixel unit 6 of the first semiconductor chip 2, the pixel driving wiring 9 is selected by the vertical driving circuit 7, by the pulse voltage supplied through the selected pixel driving wiring 9, the pixels 5 of one row corresponding thereto are driven simultaneously, and the signals of the pixels 5 are output to the vertical signal line 10.

The second semiconductor chip 3 includes, as shown in FIG. 2B, a column circuit 11 formed at a center region of the surface side of the semiconductor substrate 16, and horizontal driving circuits 13 [13A and 13B] provided at both upper and lower sides of the column circuit region. A control circuit 12 and a signal processing circuit 14 are formed at both right and left sides of the column circuit region. The column circuit 11 is installed according to the pixel column of the pixel unit 6 as much as the same number as the pixel columns. In other words, the numerical relation between the pixel columns of the pixel unit 6 and the column circuits 11 becomes 1:1. In the column circuit 11, for example, column circuits 11A corresponding to the odd number columns of the pixel unit 6 are arranged at the upper end side in the horizontal direction of the semiconductor substrate 16, and column circuits 11B corresponding to even number columns of the pixel unit 6 are arranged at the lower end side in the horizontal direction of the semiconductor substrate 16.

In other words, the column circuits 11 [11A and 11B] are arranged corresponding to the pixel columns near the center of the pixel unit 6 formed at the first semiconductor chip. In addition, the column circuits 11A of odd number pixel columns disposed at the upper and lower location in the vertical direction and the column circuits 11B of even number pixel columns are arranged to face each other so that their input terminals (corresponding to the micro bump 4) face each other. Since the column circuits 11A corresponding to odd number pixel columns and the column circuits 11B corresponding to even number pixel columns are disposed at locations corresponding to odd number columns and even number columns of each pixel 5, they are arranged to be dislocated by one pitch of the pixel column in the horizontal direction. Each column circuit 11 is formed to have a width d1 identical to the width d2 of two pixel columns of the pixel unit 6 (d1=d2). In addition, in the first semiconductor chip 2, the vertical signal line 10 reading signals of pixels in odd number columns and the vertical signal line reading signals of pixels in even number columns are connected at a side where the upper and lower column circuits 11A and 11B encounter in the second semiconductor chip 3.

As described above, the control circuit 12 receives data instructing an input clock, an operation mode or the like and outputs data including information of the solid-state imaging device. In addition, the control circuit 12 supplies necessary clocks or pulses to each component as below.

The column circuit 11 supplies a bias current to the pixel 5 and receives a signal of pixels 5 in each column to perform CDS (collated double sampling: removal or processing of fixed-patterned noise), signal amplification or AD conversion to the signal.

The horizontal driving circuit 13 [13A and 13B] selects the column circuits 11 in order and leads the signal to the signal processing circuit. The signal processing circuit 14 processes and outputs the signal. For example, the signal processing circuit 14 may perform only buffering or perform black level adjustment, column deviation correction, signal amplification, color-related processing or the like.

The first semiconductor chip 2 and the second semiconductor chip 3 are electrically and mechanically connected through the micro bump 4 by arranging their surfaces where wirings are formed, namely wiring surfaces of the pixels, to face each other. In the first semiconductor chip 2, a plurality of wiring layers are formed through an interlayer isolation film on a surface opposite to the light receiving surface of the semiconductor substrate 8 having the pixel unit 6. In the second semiconductor chip 3, a plurality of wiring layers are formed through an interlayer isolation film on the surface of the semiconductor substrate 16 where the column circuit 11, the horizontal driving circuit 13, the control circuit 12 and the signal processing circuit 14 are formed. The micro bumps 4 are formed at the first semiconductor chip 2 side, at the second semiconductor chip 3 side, or at both sides of semiconductor chips 2 and 3. In the drawings, the micro bump 4 is depicted only at the lower second semiconductor chip 3 side. The micro bump 4 connects the vertical signal line 10 of the pixel unit 6 to the column circuit 11.

In this example, the micro bump 4 is formed at the wiring surface of the second semiconductor chip 3, formed at locations where the column circuit 11A corresponding to odd number columns of the pixel unit 6 and the column circuit 11B corresponding to even number columns face each other. Through the micro bump 4, the input terminal of each column circuit 11 located near the center is electrically connected to the center portion of the vertical signal line 10 of the pixel unit 6. The column circuit 11 is disposed to face the vertical signal line 10 based on the center portion of the pixel unit 6 in the vertical direction. In other words, the column circuit 11 is disposed to face the vertical signal line 10 based on the micro bump 4 near the center of the pixel unit 6 in the vertical direction. The micro bump 4 is also formed at a location, not shown, around the second semiconductor chip 3, and power and information about the driving of pixels are exchanged through the micro bump 4 formed around the second semiconductor chip 3.

Figure 3:
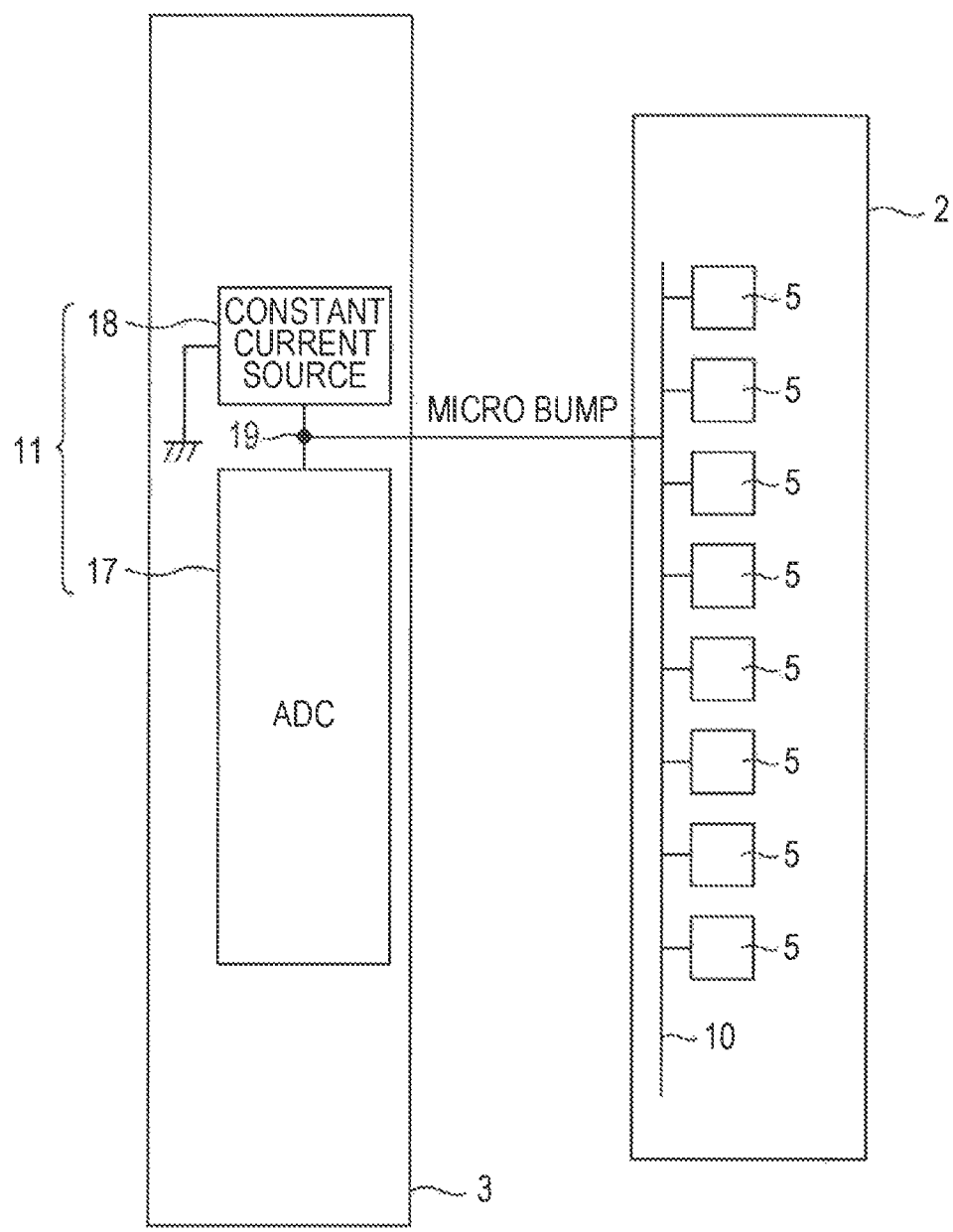
FIG. 3 is a block diagram showing a connection relation between pixels and a column circuits in an embodiment of the present disclosure.

The pixel 5 and the column circuit 11 are connected as shown in FIG. 3. Regarding the pixel unit 6 of the first semiconductor chip 2, a plurality of pixels 5 disposed in each column are connected to the vertical signal line 10. Meanwhile, in the second semiconductor chip 3, the column circuit 11 is formed corresponding to each pixel column. In the pixel unit 6, namely near the center of the pixel unit 6 in this example, the vertical signal line 10 and the column circuit 11 are connected at the micro bump 4. Here, the column circuit 11 has a constant current source 18 and an analog/digital converting circuit (ADC) 17. The constant current source 18 allows a bias current to flow through the pixel 5. The bias current flows from a power terminal in a selected pixel 5 through the vertical signal line 10 and the micro bump 4 to a ground terminal in the constant current source 18. The analog/digital converting circuit 17 shares a node 19 of the micro bump 11 with the constant current source 18, collects a voltage of the node which is an output of the pixel, and performs analog/digital conversion thereto. In other words, in the column circuit 11, a path allowing a bias current to flow to the pixel 5 and a path collecting a signal of the pixel 5 share the connection portion through the micro bump 4.

Figure 4:
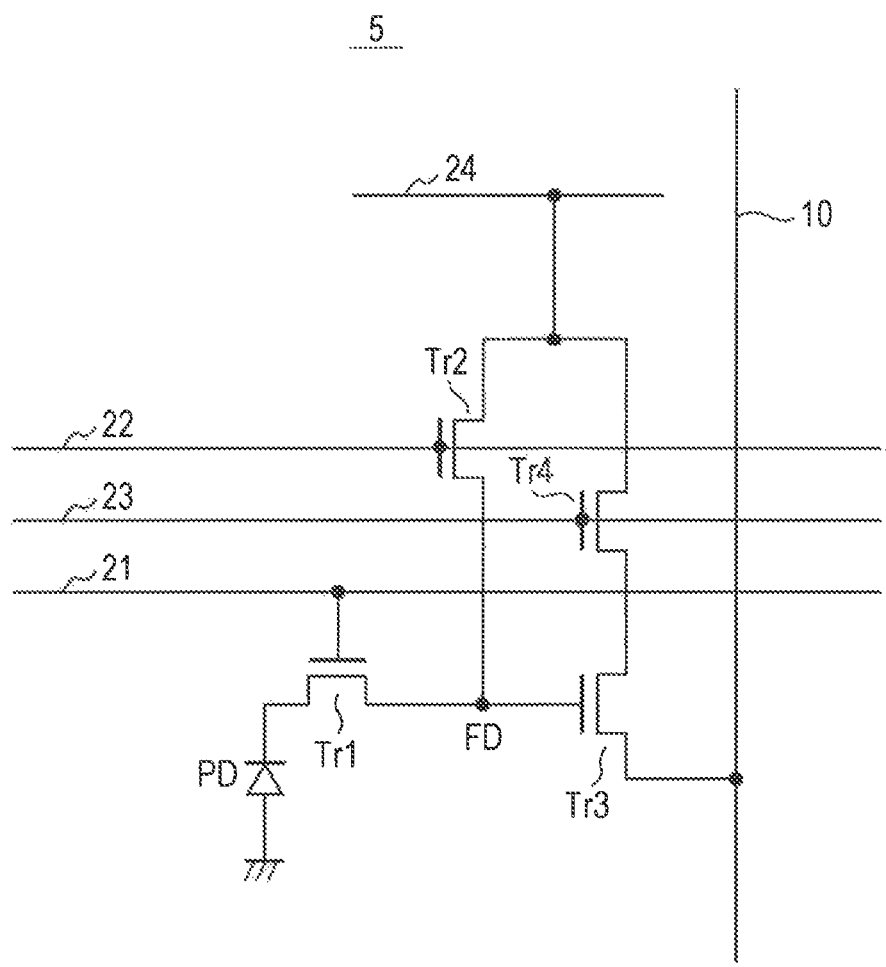
FIG. 4 is an equivalent circuit diagram showing one example of a unit pixel according to the embodiment of the present disclosure.

FIG. 4 shows an example of an equivalent circuit of the pixel. The pixel includes a photodiode serving as a photoelectric conversion unit and a plurality of pixel transistors composed of a transmission transistor Tr1, a reset transistor Tr2, an amplification transistor Tr3 and a selection transistor Tr4 in this example. The photodiode (PD) is connected through the transmission transistor Tr1 to the floating diffuser (FD). The transmission transistor Tr1 transmits charges of the photodiode (PD) (e.g., photoelectrons) to the floating diffuser (FD). The floating diffuser (FD) is connected to the gate of the amplification transistor Tr3. The amplification transistor Tr3 outputs a signal corresponding to the potential of the floating diffuser (FD) to the vertical signal line 10 if the selection transistor Tr4 turns on. The reset transistor Tr2 is connected to the floating diffuser (FD) and discharges changes of the floating diffuser (FD) to a power wiring to reset the floating diffuser (FD). The equivalent circuit of the pixel 5 is not novel but a general one. Three wirings 21, 23 and 22 respectively connected to the gates of the transmission, selection and reset transistors Tr1, Tr4 and Tr2 correspond to the above pixel driving wirings 9.

Figure 5A:
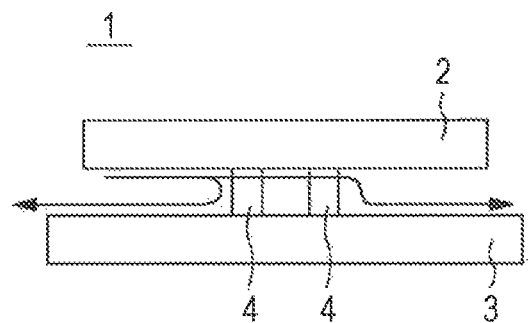
FIGS. 5A to 5E are diagrams illustrating operations of the solid-state imaging device according to the first embodiment.
Figure 5B:
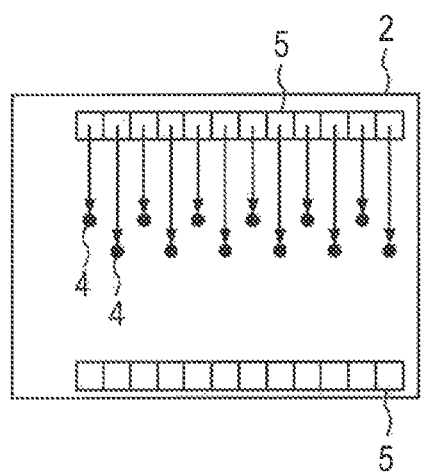
Figure 5C:
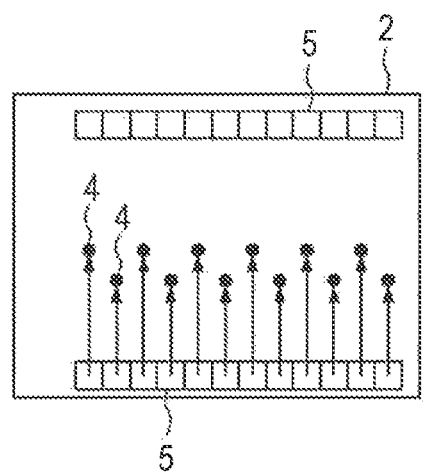
Figure 5D:
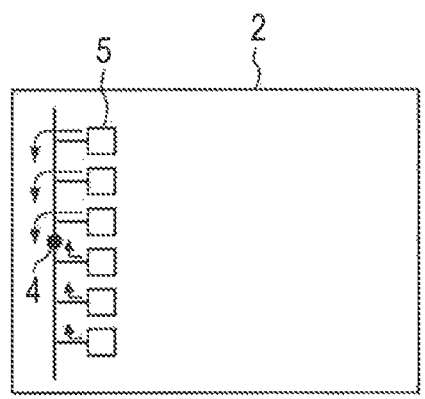
Figure 5E:
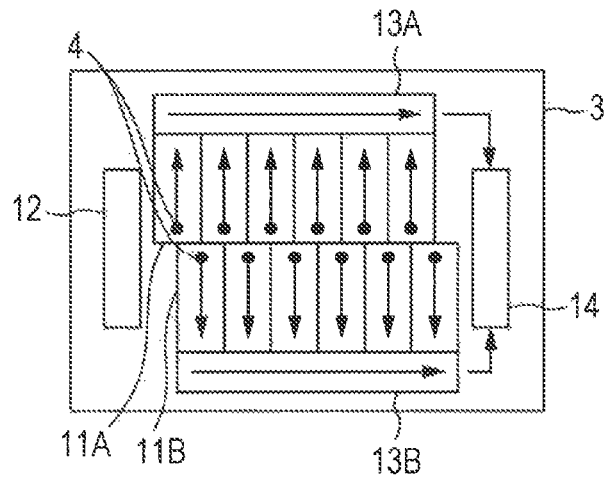

FIGS. 5A to 5D show operations of the solid-state imaging device according to the first embodiment, namely the flow of signals from the pixel. In the pixel unit 6 of the first semiconductor chip 2, signals of the pixels 5 are read by the vertical signal line 10 in the upwards order from a first pixel row to $n^{th}$ pixel row. In the pixel unit 6, the signals of upper-half (upper) pixels 5 pass the vertical signal line 10 in the order from the first pixel row to the $m^{th}$ pixel row (see FIGS. 5B and 5D), and are input to the column circuit 11 of the second semiconductor chip 3 through the micro bump 4 near the center of the pixel unit 6. In the pixel unit 6, the signals of lower-half (lower) pixel 5 pass the vertical signal line in the order from the $m+1^{th}$ pixel row to the $n^{th}$ pixel row (see FIGS. 5C and 5D), and are input to the column circuit 11 of the second semiconductor chip 3 through the micro bump 4 near the center of the pixel unit 6. Here, the signals of odd number column pixels 5 are input to the upper column circuit 11A (see FIG. 5E), and the signals of even number column pixels 5 are input to the lower column circuit 11B (see FIG. 5E). The column circuit 11 [11A and 11B] performs the necessary processes in order, the signals of odd number columns are sent to the signal processing circuit by the upper vertical driving circuit 13A, and the signals of even number columns are sent to the signal processing circuit 14 by the lower horizontal driving circuit 13B (see FIG. 5E). In other words, the signals of pixels 5 in a pixel column are input to an input terminal where the column circuits 11A and 11B face each other. The signals of the column circuits 11A and 11B are output to the horizontal driving circuits 13A and 13B from an output terminal of a side where the column circuits 11A and 11B do not face each other.

According to the solid-state imaging device 1 of the first embodiment, the center portion of the pixel unit 6 of the first semiconductor chip 2 is connected to the second semiconductor chip 3, and the wiring resistance of the vertical signal line 10 becomes identical for the signal of any one signal in the upper and lower portions of the pixel unit 6. Compared with the general configuration where pixel signals are collected from the terminal of the vertical signal line to the column circuit, in the first embodiment, the maximal length of the vertical signal line 10 is halved until signals enter the column circuit 11. For this reason, in this embodiment, the shading caused by the voltage drop is halved due to the wiring resistance of the vertical signal line 10. In addition, the shading is vertically symmetric with the center portion of the pixel unit 6 as a border and therefore is not easily observed. For example, if the upper half portion of the image is "light (shade)", the lower half portion becomes "light (shade)", thereby preventing the shading from standing out.

As described above, in the first embodiment, it is possible to decrease the voltage drop in the vertical signal line 10 and to decrease shading caused by the voltage drop. In addition, when being applied to a camera, an image region corresponding to the periphery of the imaging lens is generally dark and is generally corrected in a circuit system. As the shading of the image is vertically symmetric, the correction may be easily performed. In this embodiment, it is possible to improve the image quality by enhancing the shading.

In addition, since the maximal voltage drop is halved by the wiring resistance of the vertical signal line 10, this contributes to ensuring a voltage margin or lowering the voltage. Here, the voltage margin means room for the operation voltage of a pixel circuit to linearly output signals up to a saturation signal, room for the voltage to match an output range of the pixel with an input range of the column circuit, or the like. The dynamic range of the voltage margin may widen as much if the process is changed to increase the amount of charges handled. Since the width d1 of the column circuit 11 corresponds to the width d2 of two pixel columns, the column circuit 11 may be easily made.

In this embodiment, the first semiconductor chip 2 having the rear-side incident type pixel unit 6 is mounted in a flip-chip manner to the second semiconductor chip 3 while the wiring of the pixel 5 is at a lower side, and therefore it is possible to implement the solid-state imaging device without influencing light receiving or photoelectric conversion.

3. Second Embodiment

Example of the Solid-State Imaging Device

Figure 6:
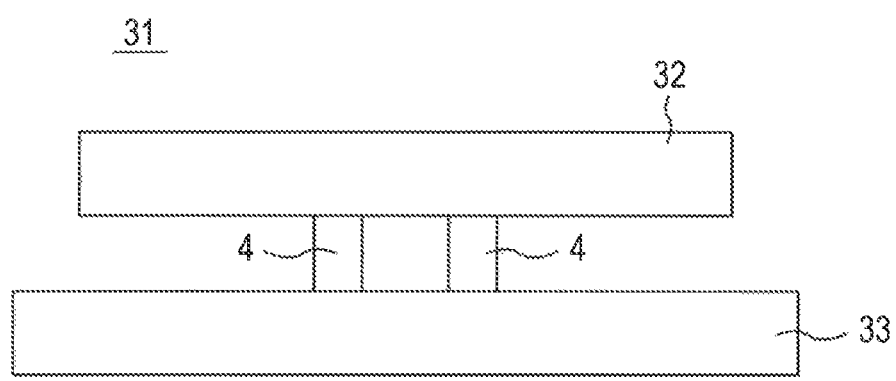
FIG. 6 is a schematic view showing a second embodiment of the solid-state imaging device according to the present disclosure.
Figure 7A:
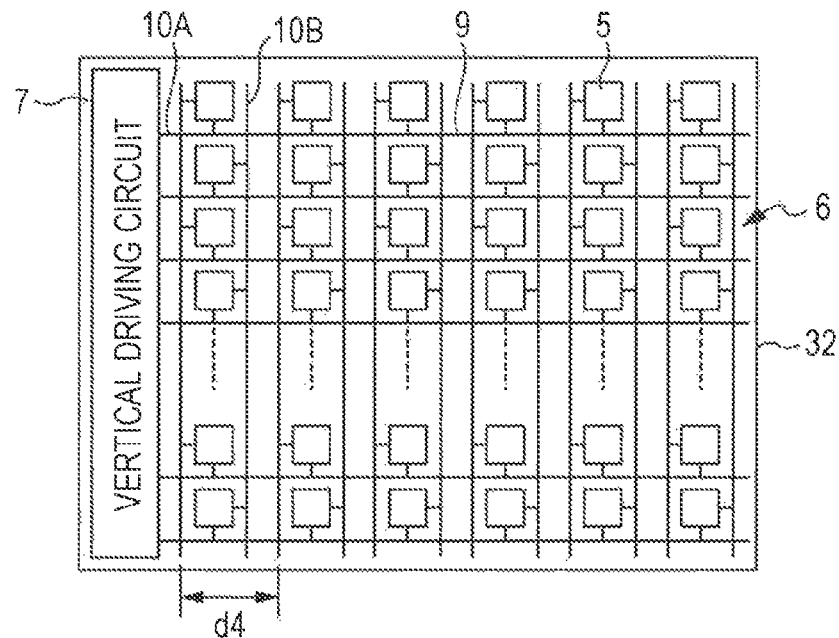
FIGS. 7A and 7B are schematic plan views showing a first semiconductor chip and a second semiconductor chip according to the second embodiment.
Figure 7B:
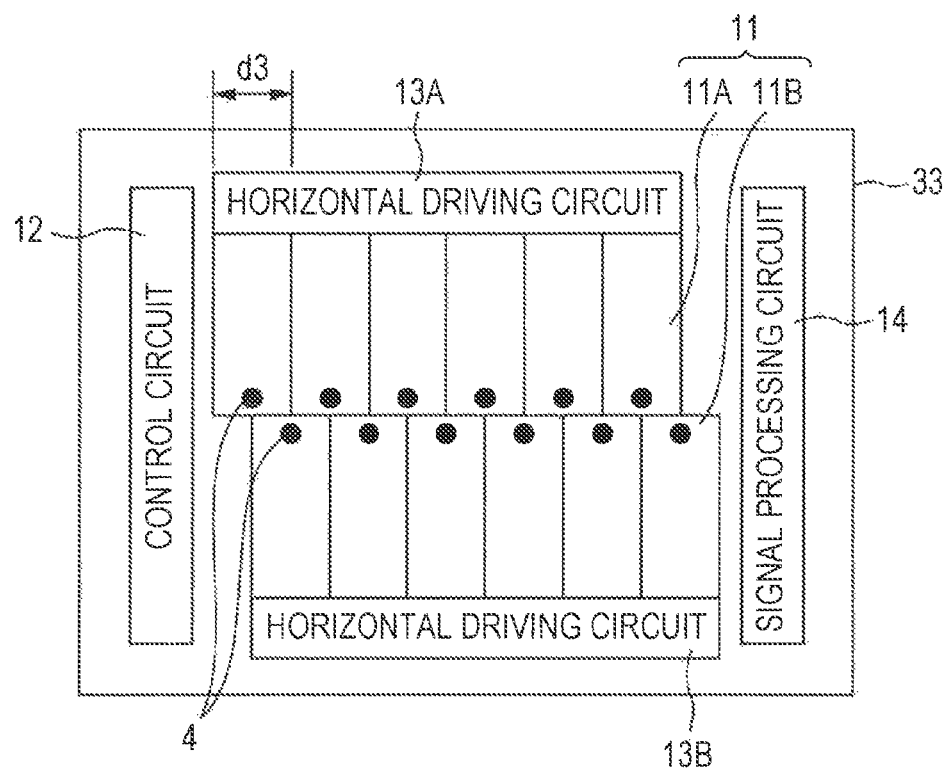
Figure 8A:
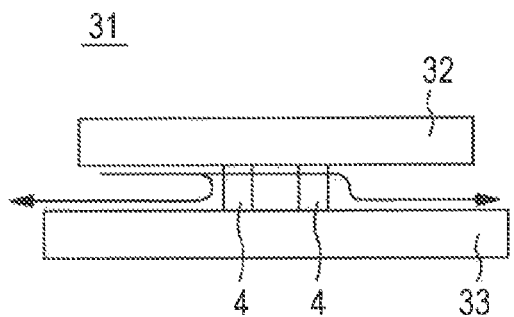
FIGS. 8A to 8E are diagrams illustrating operations of the solid-state imaging device according to the second embodiment.
Figure 8B:
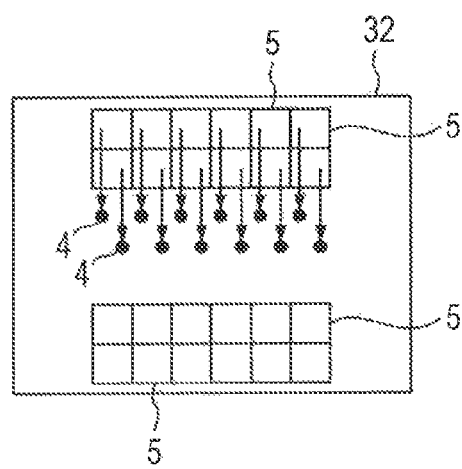
Figure 8C:
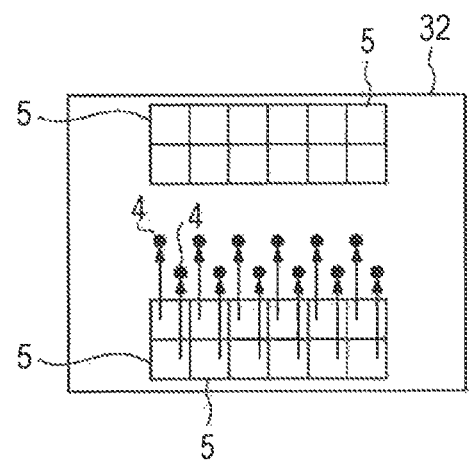
Figure 8D:
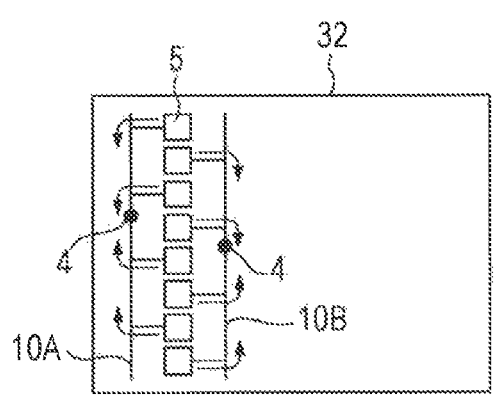
Figure 8E:
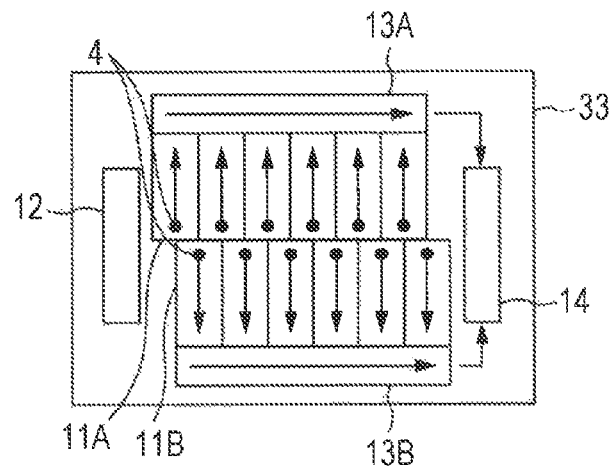

FIGS. 6 to 7B show a second embodiment of the solid-state imaging device according to the present disclosure. This embodiment is a rear-side incident type CMOS solid-state imaging device, and FIGS. 6 to 7B are schematic views.

In a solid-state imaging device 31 according to the second embodiment, as shown in FIG. 6, a first substrate 32 having a pixel unit in which a plurality of pixels converting physical quantities into electric signals are arranged in a two-dimensional shape and a second substrate 33 having column circuits are laminated and electrically connected to each other through a connection portion 4. Hereinafter, the first substrate 32 will be called a first semiconductor chip, and the second substrate 33 will be called a second semiconductor chip. In addition, the connection portion 4 will be called a micro bump. In other words, the first semiconductor chip 32 includes, as shown in FIG. 7A, a pixel unit 6 in which a plurality of rear-side incident type pixels 5 are arranged in a two-dimensional shape, and a vertical driving circuit 7. The first semiconductor chip 32 becomes a so-called rear-side incident type CMOS image sensor chip. The second semiconductor chip 33 is, as shown in FIG. 7B, configured by forming a column circuit 11, a control circuit 12, horizontal driving circuits 13 [13A and 13B], and a signal processing circuit 14 corresponding to an output circuit. The first semiconductor chip 32 is mounted in a flip-chip manner to the lower second semiconductor chip 33 through the micro bump 4 to configure the solid-state imaging device 31.

In this embodiment, pixels 5 in two rows are read simultaneously. In the pixel unit 6 of the first semiconductor chip 32, two vertical signal lines 10 [10A and 10B] are arranged for one pixel column, so that the first vertical signal line 10A is connected to odd number pixel rows and the second vertical signal line 10B is connected to even number pixel rows. The column circuit 11 of the second semiconductor chip 33 has a width d3 identical to the width d4 of the pixel column (d3=d4), and is arranged as much as two times of the pixel columns corresponding to the number of the vertical signal lines 12. The column circuits 11 are arranged as much as the number of the pixel columns in the horizontal direction respectively to the upper and lower ends in the vertical direction. In other words, the numerical relation between the pixel columns of the pixel unit 6 and the column circuits 11 becomes 1:2.

The column circuit 11A at the upper end is connected to the first vertical signal line 10A connected to the pixels 5 in odd number rows among the pixel columns. The column circuit 11B at the lower end is connected to the second vertical signal line 10B connected to the pixels 5 in even number rows among the pixel columns. The column circuit 11A at the upper end and the column circuit 11B at the lower end are arranged to be dislocated in the horizontal direction as much as a half pitch of the pixel column. The column circuit 11A at the upper end and the column circuit 11B at the lower end are arranged to face each other so that their input terminals (portions corresponding to the micro bump 4) face each other.

In addition, the input terminal of each column circuit 11A and 11B located near the center and the center portion of the vertical signal lines 10A and 10B of the pixel unit 6 are electrically connected through the micro bump 4. The center portion of the first vertical signal line 10A and the input terminal of the column circuit 11A at the upper end are connected through the micro bump 4, and the center portion of the second vertical signal line 10B and the input terminal of the column circuit 11B at the lower end are connected through the micro bump 4.

Other configurations are identical to those illustrated in the first embodiment, and therefore the corresponding component will be designated by the same reference symbol and not described again.

FIGS. 8A to 8E show operations of the solid-state imaging device according to the second embodiment, namely the flow of signals from the pixel. In the pixel unit 6 of the first semiconductor chip 32, signals are read by the first and second vertical signal lines 10A and 10B in the downwards order for every two pixel rows. The signals of upper-half pixels 5 of the pixel unit 6 pass the first and second vertical signal lines 10A and 10B in the order from the first and second pixel rows to two of m–1$^{th}$ and m$^{th}$ pixel rows (see FIGS. 8B and 8D), and are input to the column circuit 11 of the second semiconductor chip 33 simultaneously through the micro bump 4 near the center of the pixel unit 6 (see FIG. 8E). Here, the signals of the pixels 5 of odd number rows are input to the column circuit 11A at the upper end, and the signals of the pixels 5 of even number rows are input to the column circuit 11B at the lower end. The column circuits 11A and 11B in which the signals of two pixel rows are simultaneously input perform necessary process in order so that the signals in the odd number rows are sent to the signal processing circuit 14 by the horizontal driving circuit 13A at the upper side and the signals in the even number rows are sent to the signal processing circuit 14 by the horizontal driving circuit 13B at the lower side. In other words, the signals of the pixels 5 of two pixel rows are input to the input terminals of the column circuits 11A and 11B which face each other. The signals of the column circuits 11A and 11B are output from the output terminals of the column circuits 11A and 11B, which do not face each other, to the horizontal driving circuits 13A and 13B.

According to the solid-state imaging device 31 of the second embodiment, since the number of column circuits 11 is twice the number of the pixel columns, it is possible to increase the processing rate by approximately double compared with the first embodiment. Since the load capacity of the vertical signal line 10 [10A and 10B] is substantially halved, in the case where a reading rate is rate-controlled by the pixels, the processing rate may be further increased by approximately double.

Besides, the same effects as obtained in the first embodiment may be obtained. In other words, since the first semiconductor chip 32 is connected to the second semiconductor chip 33 near the center of the pixel unit 6, the wiring resistances of the vertical signal lines 10 [10A and 10B] are identical for any signal of the upper and lower portions of the pixel unit 6. Compared with the general configuration where pixel signals are collected from the end of the vertical signal line to the column circuit, in the second embodiment, the maximal length of the vertical signal lines 10 [10A and 10B] is halved until the signals enter the column circuits 11 [11A and 11B]. For this reason, in this embodiment, the shading caused by the voltage drop is halved due to the wiring resistance of the vertical signal line. In addition, the shading is vertically symmetric with the upper and lower portion of the pixel unit 6 and therefore is not easily observed. As described above, in the second embodiment, it is possible to decrease the voltage drop in the vertical signal line 10 and to decrease shading caused by the voltage drop. Therefore, it is possible to improve the image quality by enhancing the shading.

In addition, since the maximal voltage drop is halved by the wiring resistance of the vertical signal lines 10 [10A and 10B], this contributes to ensuring a voltage margin or lowering the voltage. The dynamic range of the voltage margin may widen as much if the process is changed to increase the amount of charges handled.

Even in the second embodiment, since the first semiconductor chip 32 having the rear-side incident type pixel unit 6 is mounted in a flip-chip manner to the second semiconductor chip 33 while the wiring of the pixel 5 is at a lower side, it is possible to implement the solid-state imaging device without influencing light receiving or photoelectric conversion.

4. Third Embodiment

Example of the Solid-State Imaging Device

Figure 9:
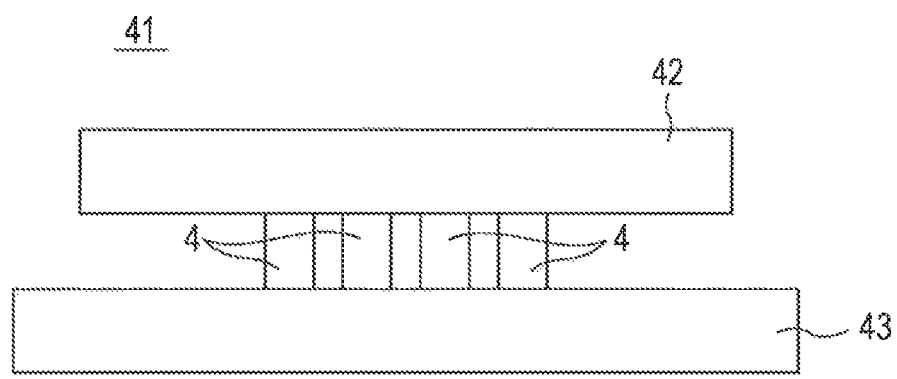
FIG. 9 is a schematic view showing a third embodiment of the solid-state imaging device according to the present disclosure.
Figure 10A:
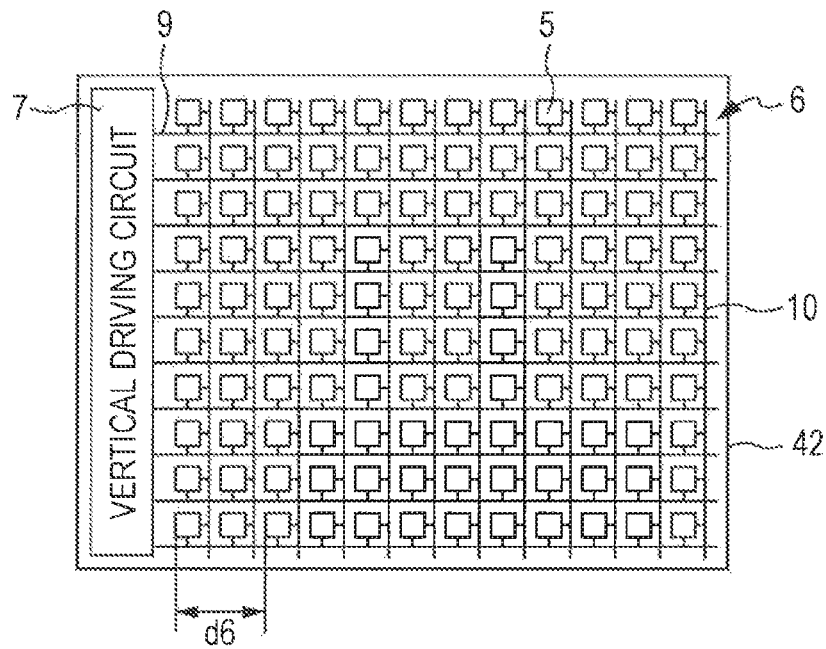
FIGS. 10A and 10B are schematic plan views showing a first semiconductor chip and a second semiconductor chip according to the third embodiment.
Figure 10B:
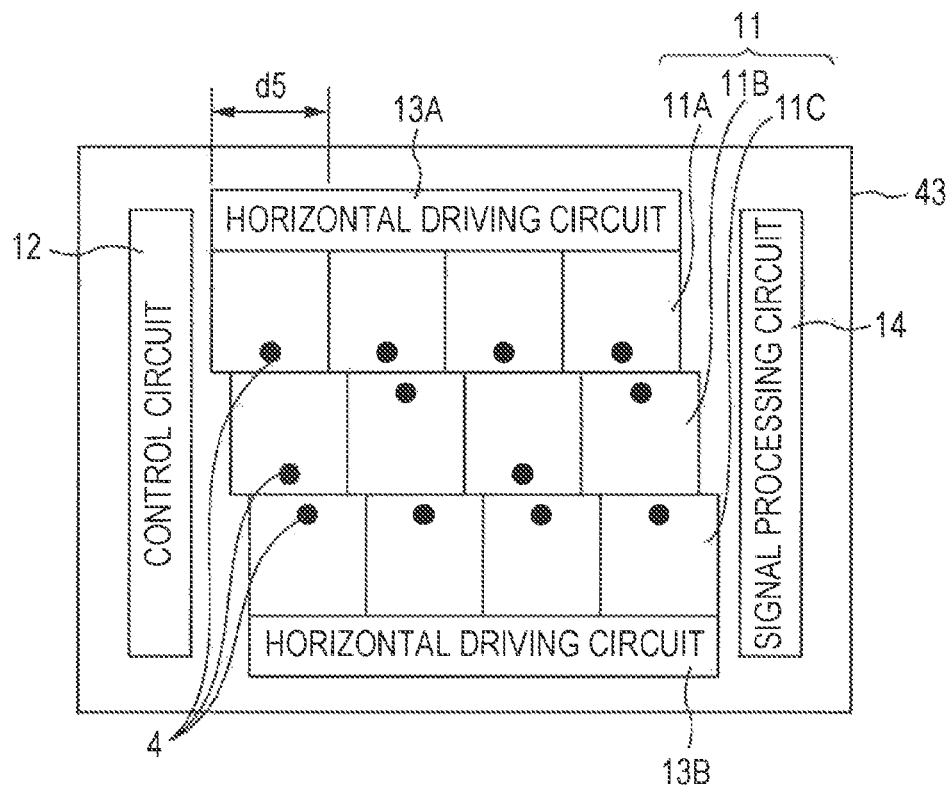

FIGS. 9 to 10B show a third embodiment of the solid-state imaging device according to the present disclosure. This embodiment is a rear-side incident type CMOS solid-state imaging device, and FIGS. 9 to 10B are schematic views.

In a solid-state imaging device 41 according to the third embodiment, a first substrate 42 having a pixel unit in which a plurality of pixels converting physical quantities into electric signals are arranged in a two-dimensional shape and a second substrate 43 having column circuits are laminated and electrically connected to each other through a connection portion 4. Hereinafter, the first substrate 42 will be called a first semiconductor chip, and the second substrate 43 will be called a second semiconductor chip. In addition, the connection portion 4 will be called a micro bump. In other words, the first semiconductor chip 42 includes, as shown in FIG. 10A, a pixel unit 6 in which a plurality of rear-side incident type pixels 5 are arranged in a two-dimensional shape, and a vertical driving circuit 7. The first semiconductor chip 42 becomes a so-called rear-side incident type CMOS image sensor chip. The second substrate 43 is, as shown in FIG. 10B, configured by forming a column circuit 11, a control circuit 12, horizontal driving circuits 13 [13A and 13B], and a signal processing circuit 14 corresponding to an output circuit. The first semiconductor chip 42 is mounted in a flip-chip manner to the lower second semiconductor chip 43 through the micro bump 4 to configure the solid-state imaging device 41.

In the pixel unit 6 of the first semiconductor chip 42, a vertical signal line 10 to which a plurality of pixels 5 are connected is formed corresponding to each pixel column. Meanwhile, in the second semiconductor chip 43, three column circuits 11 [11A, 11B and 11C] are disposed in the vertical direction. The column circuits 11A, 11B and 11C are respectively arranged in plural in the horizontal direction. The column circuit 11A at the upper end correspond to every third pixel column of the pixel unit 6, namely a first pixel column, a fourth pixel column, a seventh pixel column, a tenth pixel column, . . . . The column circuit 11B at the middle corresponds to every third pixel column of the pixel unit 6, namely a second pixel column, a fifth pixel column, an eighth pixel column, an eleventh pixel column, . . . . The column circuit 11C at the lower end corresponds to every third pixel column of the pixel unit 6, namely a third pixel column, a sixth pixel column, a ninth pixel column, a twelfth pixel column, . . . .

Each column circuit 11A to 11C is formed with a width d5 equal to the width d6 of three columns of the pixels 5 (d5=d6). The column circuits 11B and 11C are arranged to be dislocated in the horizontal direction with respect to the column circuits 11A and 11B at the upper end as much as one pitch of the pixel column.

The micro bump 4 connecting the column circuit 11A at the upper end to the vertical signal line 10 of a corresponding pixel column is formed at a location corresponding to the center input terminal in the second semiconductor chip 43 of the column circuit 11A at the upper end. The micro bump 4 connecting the column circuit 11C at the lower end to the vertical signal line 10 of a corresponding pixel column is formed at a location corresponding to the center input terminal in the second semiconductor chip 43 of the column circuit 11C at the lower end. The micro bump 4 connecting the column circuit 11B at the middle to the vertical signal line of a corresponding pixel column is formed at a location near the column circuit 11C at the lower end and a location near the column circuit 11A at the upper end in turns in the horizontal direction.

Other configurations are identical to those illustrated in the first embodiment, and therefore the corresponding component will be designated by the same reference symbol and not described again.

Figure 11A:
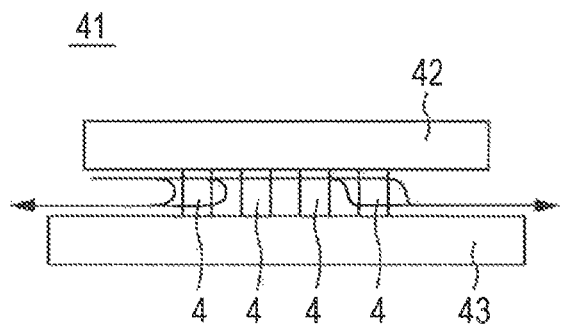
FIGS. 11A to 11D are diagrams illustrating operations of the solid-state imaging device according to the third embodiment.
Figure 11B:
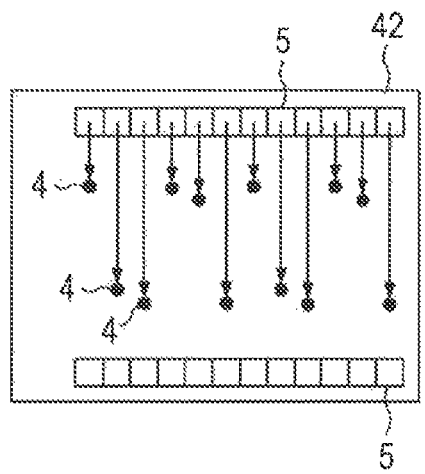
Figure 11C:
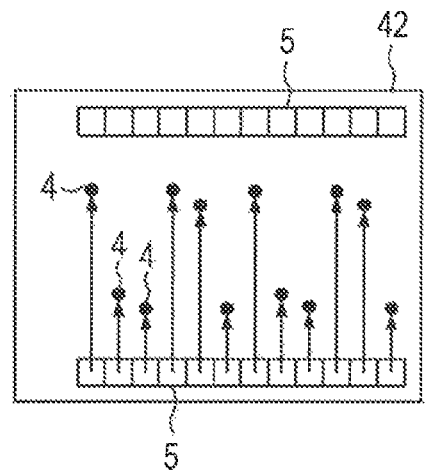
Figure 11D:
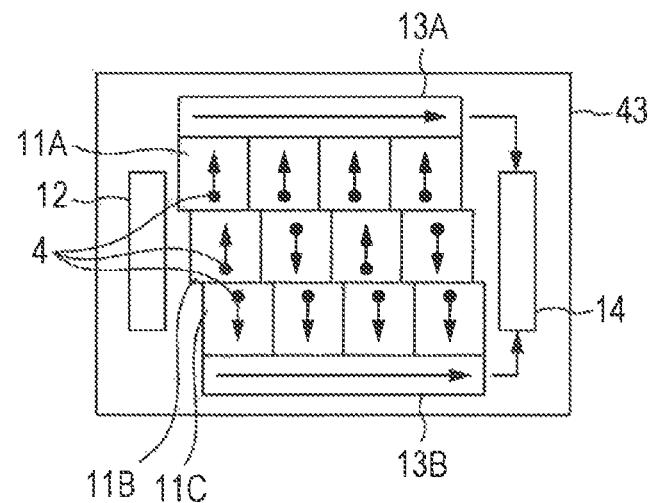

FIGS. 11A to 11D show operations of the solid-state imaging device 41 according to the third embodiment, namely the flow of signals from the pixel. In the pixel unit 6 of the first semiconductor chip 42, signals of the pixels 5 are read by the vertical signal line 10 in the downwards order for every one pixel row. FIGS. 11B and 11D show the flow of signals read from the upper portion of the pixel unit 6. The vertical location of the micro bump 4 connecting the vertical signal line 10 to the column circuit 11 is dislocated from the center portion of the vertical signal line 10, and the dislocated position varies depending on pixel columns as shown in the figures. In addition, in the upper half-portion of the pixel unit 6, as shown in the figures, the signals of the pixels 5 of the first pixel column, the fourth pixel column, the seventh pixel column, . . . pass the vertical signal line 10 and are input to the column circuit 11A at the upper end through the micro bump 4 near ⅓ location in the vertical direction of the pixel unit 6. The signals of the pixels 5 of the second pixel column, the fifth pixel column, the eighth pixel column, . . . pass the vertical signal line 10 and are input to the column circuit 11B at the middle through the micro bump near ⅓ location and ⅔ location in the vertical direction of the pixel unit 6 in alternate shifts. The signals of the pixels 5 of the third pixel column, the sixth pixel column, the ninth pixel column, . . . pass the vertical signal line 10 and are input to the column circuit 11C at the lower end through the micro bump 4 near ⅔ location in the vertical direction of the pixel unit 6. In addition, among the signals input to the column circuits 11A to 11C, the signals of the first pixel column, the second pixel column, the fourth pixel column, the seventh pixel column, the eighth pixel column, the tenth pixel column, . . . are sent to the signal processing circuit 14 by the horizontal driving circuit 13A at the upper end. The signals of the third pixel column, the fifth pixel column, the sixth pixel column, the ninth pixel column, the eleventh pixel column, and the twelfth pixel column . . . are sent to the signal processing circuit 14 by the horizontal driving circuit 13B at the lower end.

In regard to reading of signals of lower-half pixels 5 of the pixel unit 6, as shown in FIGS. 11C and 11D, though not described in detail, the signal of pixels 5 of each pixel column passes the vertical signal line 10 and is input through the same micro bump 4 as above to the corresponding column circuits 11A to 11C. In addition, the signal processed by each column circuit 11A to 11C is sent to the signal processing circuit 14 by the horizontal driving circuits 13A and 13B.

According to the solid-state imaging device 41 of the third embodiment, the signal of each pixel 5 is input through the micro bump 4 to the column circuit 11 at a middle location near ⅓ or ⅔ of the vertical signal line, though it is not the center portion of the vertical signal line 10. For this reason, the wiring resistance of the vertical signal line 10 is decreased compared with a general solid-state imaging device, resulting in decreasing shading caused by a voltage drop due to the wiring resistance. Therefore, it is possible to improve shading and enhance image quality.

Besides, the same effects as obtained in the first embodiment may be obtained. In other words, this contributes to ensuring a voltage margin or lowering the voltage. If the voltage margin is used for increasing the amount of charges handled, the dynamic range may widen as much. In addition, since the width d5 of the column circuit 11 corresponds to the width d6 of three pixel columns, it is easy to produce the column circuit 11.

In this embodiment, since the first semiconductor chip 2 having the rear-side incident type pixel unit 6 is mounted in a flip-chip manner to the second semiconductor chip 3 while the wiring of the pixel 5 is at a lower side, it is possible to implement the solid-state imaging device without influencing light receiving or photoelectric conversion.

Modified Examples

Modified examples common to the first to third embodiments as above will be described.

In the case where the micro bump 4 cannot help being made with a diameter greater than the width of the column circuit 11, neighboring micro bumps 4 may be arranged in a zigzag shape.

Since the horizontal driving circuits 13 [13A and 13B] have a high driving frequency and generate much heat and noise, it is preferably disposed at an end side of the second semiconductor chip, particularly at a location not overlapping with the first semiconductor chip or a location not overlapping with the pixel unit.

Figure 12:
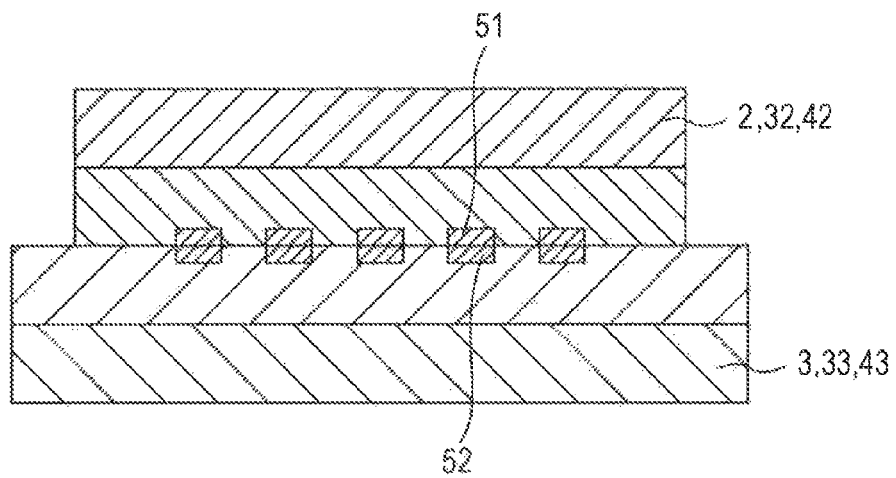
FIG. 12 is a schematic cross-sectional view showing a solid-state imaging device according to a modified example of the present disclosure.

Even though the first semiconductor chip and the second semiconductor chip are connected using the micro bump 4 in the above example, both semiconductor chips may be connected using another connecting method. For example, as shown in FIG. 12, the wirings 51 and 52 of the first semiconductor chip 2 (32, 42) and the second semiconductor chip 3 (33, 43) may be compressed so that the wirings 51 and 52 of each semiconductor chip 2 (32, 42) and 3 (33, 43) are directly connected.

Even though it has been illustrated that the solid-state imaging device uses electrons as signal charges in the above case, the present disclosure may also be applied to a case where the solid-state imaging device uses holes as signal charges.

5. Fourth Embodiment

Example of Electronic Equipment

The solid-state imaging device according to the embodiment of the present disclosure may be applied to electronic equipment such as cameras having the solid-state imaging device, camera-embedded portable devices, and other devices having the solid-state imaging device.

The electronic equipment according to this embodiment includes a solid-state imaging device, an optical system for leading incident light to the solid-state imaging device, and a signal processing circuit for processing an output signal of the solid-state imaging device as basic configuration, wherein the solid-state imaging device is configured by using the solid-state imaging device of the embodiment as described above.

Figure 13:
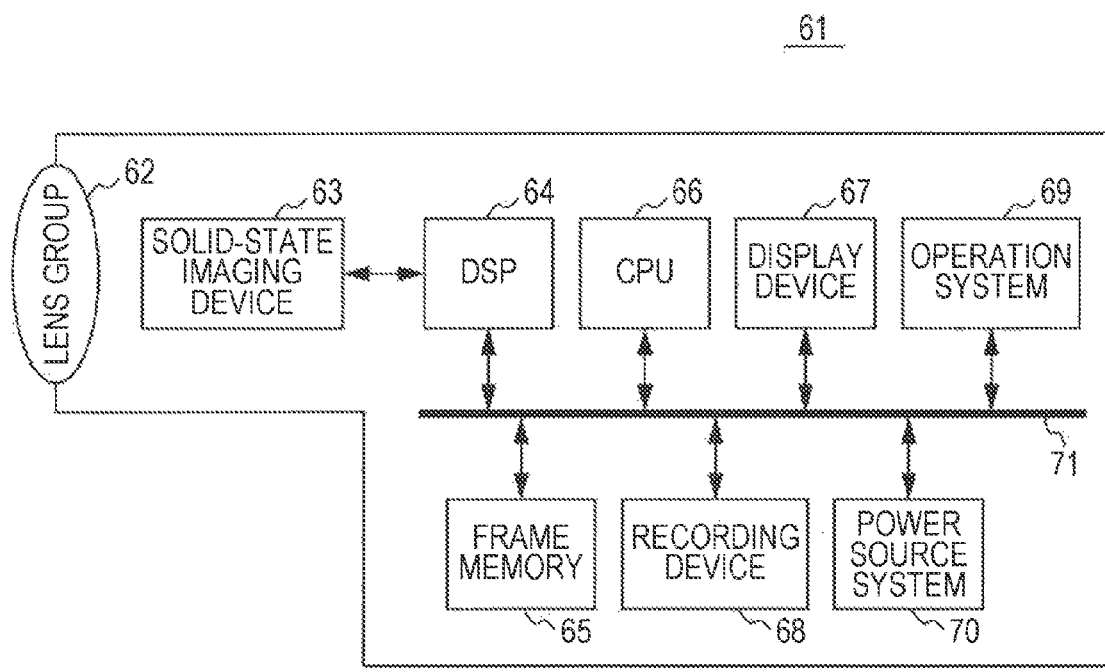
FIG. 13 is a schematic view showing electronic equipment according to a fourth embodiment of the present disclosure.

FIG. 13 shows an embodiment in which the present disclosure is applied to a camera as an example of the electronic equipment. The camera 61 according to this embodiment includes an optical lens group (optical system) 62, a solid-state imaging device 63, a DSP (Digital Signal Processor) 64, a frame memory 65, a central processing unit (CPU) 66, a display device 67, a recording device 68, an operation system 69, a power source system 70, and so on. Among them, the DSP 64, the frame memory 65, the CPU 66, the display device 67, the recording device 68, the operation system 69 and the power source system 70 are connected to a common bus line 71.

The optical lens group 62 leads an image light (incident light) from a subject to an imaging surface (a pixel array unit: a pixel unit) of a solid-state imaging device 63. To the solid-state imaging device 63, any one of the solid-state imaging devices according to the above embodiments is applied. The solid-state imaging device 63 converts the image light formed on the imaging surface by the optical lens group 62 into electric signals for each pixel. The DSP 64 controls the solid-state imaging device 63 and receives signals therefrom to generate an image signal. The frame memory 65 is a memory used for temporarily storing the image signal processed by the DSP 64.

The display device 67 displays the image signal output as a processing result of the DSP 64. The recording device 68 records the image signal on, for example, a magnetic tape, a magnetic disk, an optical disc or the like. The operation system 69 is used for operating the camera. The power source system 70 supplies power to drive the solid-state imaging device 63. The CPU controls such operations.

The present disclosure may take a camera module form in which the optical system 62, the solid-state imaging device 63, the DSP 64, the CPU 66, the frame memory 65, the power source system 70 and so on are modulated.

The present disclosure may configure a camera-embedded portable device having such a camera module, for example representatively a cellular phone.

In addition, the present disclosure may be configured as a module having the modulated imaging function as above, a so-called imaging function module. The present disclosure may configure electronic equipment equipped with such an imaging function module.

If the electronic equipment 61 such as a camera according to the fourth embodiment is used, in the solid-state imaging device, since the voltage drop caused by the wiring resistance of the vertical signal line decreases when a signal of a pixel is read, it is possible to improve image quality, for example improving the shading caused by the voltage drop. Therefore, it is possible to provide high-quality electronic equipment.

The present disclosure contains subject matter related to that disclosed in Japanese Priority Patent Application JP 2010-252587 filed in the Japan Patent Office on Nov. 11, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
a first substrate including a pixel array having a first plurality of pixels and a second plurality of pixels, at least one of the first plurality of pixels configured to output a first pixel signal and at least one of the second plurality of pixels configured to output a second pixel signal;
a connection portion; and
a second substrate including a plurality of analog to digital converters, the plurality of analog to digital converters including a first analog to digital converter and a second analog to digital converter,
wherein the first substrate and the second substrate are laminated and electrically connected to each other through the connection portion, the first analog to digital converter is configured to convey a first signal based on the first pixel signal in a first direction, the second analog to digital converter is configured to convey a second signal based on the second pixel signal in a second direction oppose to the first direction, and at least one of the first or second plurality of pixels overlaps at least a portion of the plurality of analog to digital converters in a perspective from the direction perpendicular to a plane including the pixel array.

2. The imaging device according to claim 1, wherein the first substrate includes a driving circuit coupled to at least one of the first or second plurality of pixels through at least one of a plurality of horizontal signal lines.

3. The imaging device according to claim 2, wherein the driving circuit is configured to output a driving signal to at least one of the first or second plurality of pixels.

4. The imaging device according to claim 2, wherein the driving circuit is configured to drive at least one of the first or second plurality of pixels.

5. The imaging device according to claim 2, wherein the second substrate includes a control circuit coupled to the driving circuit.

6. The imaging device according to claim 5, wherein the control circuit is configured to control the driving circuit.

7. The imaging device according to claim 1, wherein second substrate includes a plurality of processing circuits, and at least one of the plurality of processing circuits includes a portion of the plurality of analog to digital converter.

8. The imaging device according to claim 1, wherein the connection portion comprises a plurality of bumps.

9. The imaging device according to claim 1, wherein the first substrate includes a first wiring, and the second substrate includes a second wiring coupled to the first wiring.

10. The imaging device according to claim 9, wherein the first wiring is coupled to at least one of the first or second plurality of pixels, and the second wiring is coupled to the first or second analog to digital converter.

11. The imaging device according to claim 1, wherein at least one of the first or second plurality of pixels includes a photodiode, a transfer transistor, a reset transistor, an amplifier transistor, and a select transistor.

12. The imaging device according to claim 1, wherein the connection portion overlaps at least a portion of the plurality of analog to digital converters in the perspective from the direction perpendicular to the plane.

13. The imaging device according to claim 1, wherein two signal lines of a plurality of signal lines are provided for a corresponding column of pixels in the pixel array.

14. The imaging device according to claim 1, wherein respective ones of the first and second plurality of pixels are a rear-side incident type.

15. The imaging device according to claim 1, wherein the second substrate includes a current source coupled to at least one of a plurality of signal lines.

\* \* \* \* \*